US009534728B2

(12) United States Patent
Harji et al.

(10) Patent No.: US 9,534,728 B2
(45) Date of Patent: Jan. 3, 2017

(54) UNIT FOR ATTACHING AND DISTRIBUTION OF MULTIMEDIA PERIPHERALS

(71) Applicant: PRIMEX MANUFACTURING LTD., Langley (CA)

(72) Inventors: Mahmud Harji, Surrey (CA); Balin Lee, Vancouver (CA); Donovan Hammersley, White Rock (CA); Chun Nam James Chan Chan, Richmond (CA); Hong Chen, Richmond (CA)

(73) Assignee: PRIMEX MANUFACTURING LTD., Langley, BC (CA)

( * ) Notice: Subject to any disclaimer, the term of this patent is extended or adjusted under 35 U.S.C. 154(b) by 112 days.

(21) Appl. No.: 14/121,739

(22) Filed: Oct. 14, 2014

(65) Prior Publication Data

US 2016/0105977 A1  Apr. 14, 2016

(51) Int. Cl.
| H05K 5/00 | (2006.01) |
| F16M 11/00 | (2006.01) |
| H02G 3/08 | (2006.01) |
| H02G 3/04 | (2006.01) |

(52) U.S. Cl.
CPC .......... F16M 11/00 (2013.01); H02G 3/0493 (2013.01); H02G 3/086 (2013.01); H05K 5/0013 (2013.01)

(58) Field of Classification Search
CPC ...... H05K 5/0013; H05K 5/0234; H05K 5/03; F16M 11/00; H01L 23/24; H01L 23/00; H01L 23/28; H01L 23/32

USPC .......... 248/346.03; 174/521, 50; 312/223.2; 361/679.01
See application file for complete search history.

(56) References Cited

U.S. PATENT DOCUMENTS

| 7,082,036 B2 * | 7/2006 | Cheng ............... G06F 1/181 292/19 |
| 8,152,127 B2 * | 4/2012 | Chang ............... G06F 1/182 248/346.03 |
| 8,378,234 B2 | 2/2013 | Lux |
| 8,437,119 B2 | 5/2013 | Tagano |
| 8,633,383 B2 | 1/2014 | Akahori et al. |
| 8,739,997 B1 | 6/2014 | Ploof |
| 2011/0284711 A1 * | 11/2011 | Hsiao ............... B65D 19/38 248/346.03 |

* cited by examiner

*Primary Examiner* — Nkeisha Smith
(74) *Attorney, Agent, or Firm* — Frederick Kaufman Inc.

(57) ABSTRACT

The unit comprises an assembly for clasping-escaping and a receptacle-terminal assembly. The assembly for clasping-escaping includes an L-shape subassembly having a vertical wall provided with backwards projecting, vertically spaced and inverted at 90" T-beams for connecting the L-shape subassembly to a parallelepipedic open box subassembly of a receptacle-terminal assembly. A bottom plate, located at the lowest part of the vertical wall extends outwardly. A passage above the bottom plate has a base terminating in a pair of serrations. The clasping-escaping includes a flat bar that after folding itself extends into a diverging strip provided with a multitude of serrations for meshing with the pair of serrations when a component is clasped. The parallelepipedic open box subassembly incorporates a plurality of T profile protrusions for connecting with the backwards projecting, vertically spaced and inverted at 90" T-beams.

3 Claims, 9 Drawing Sheets

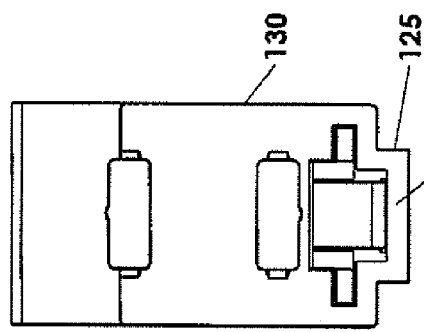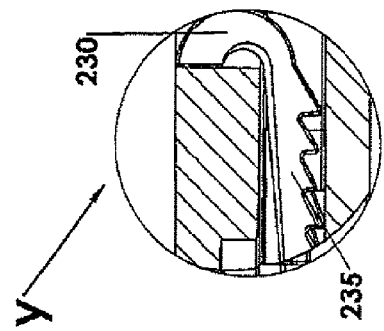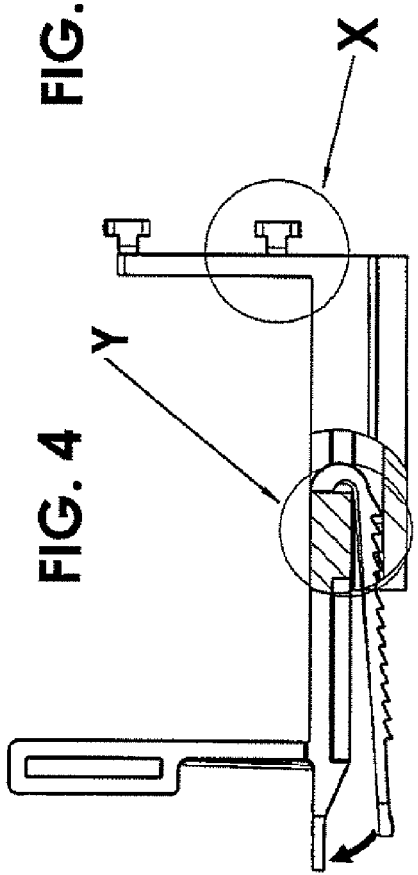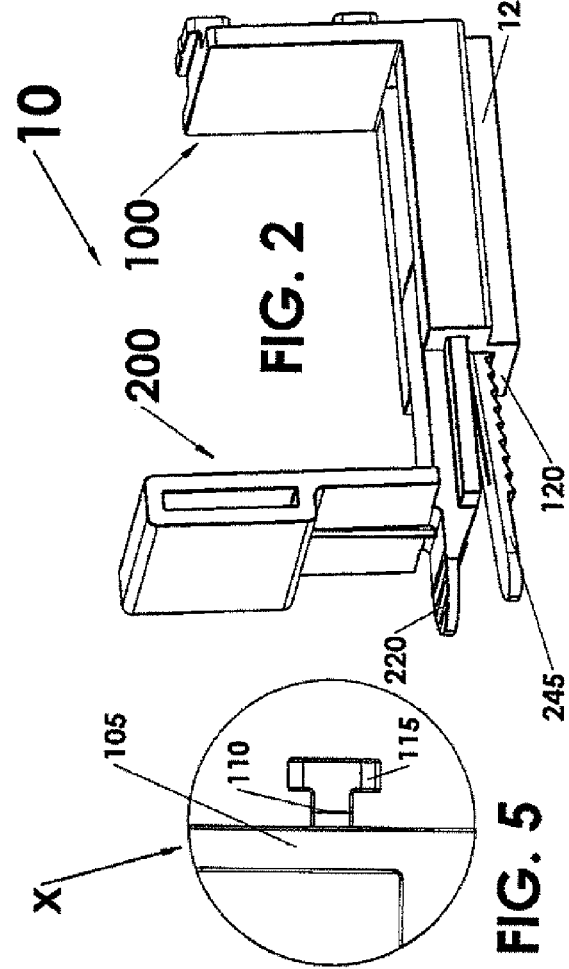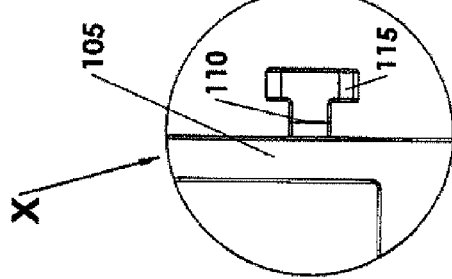

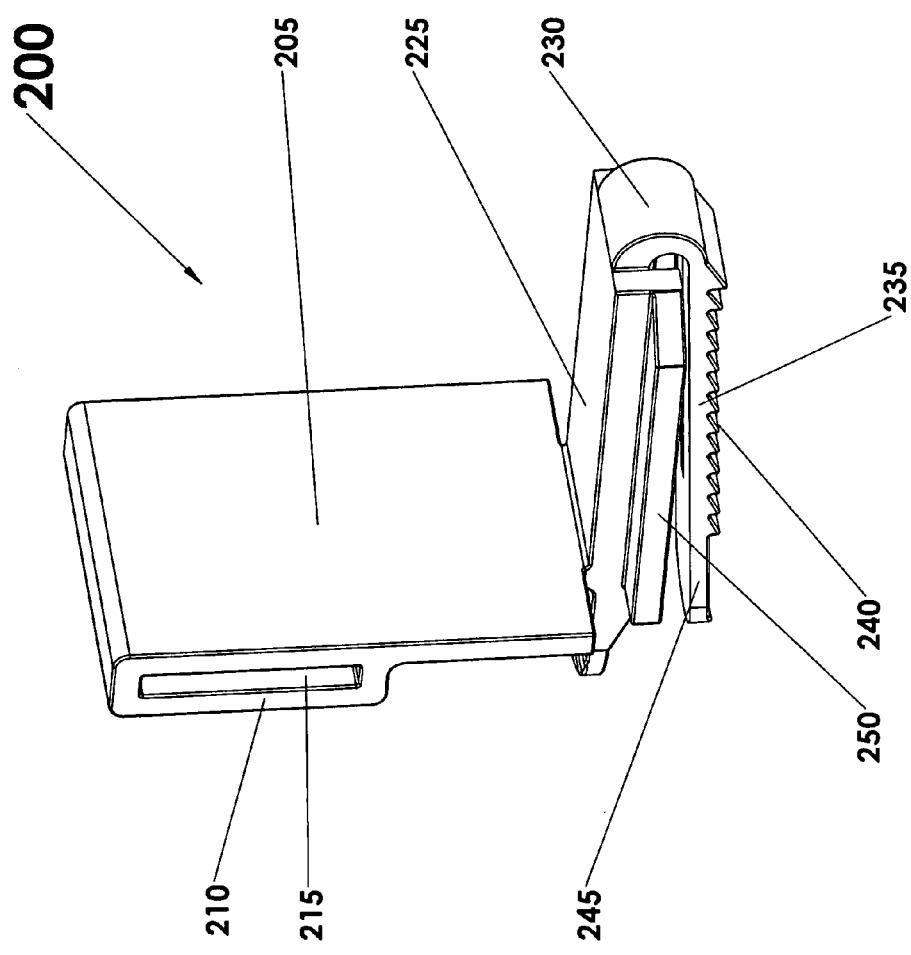

UNIT FOR ATTACHING AND DISTRIBUTION OF MULTIMEDIA PERIPHERALS

I. BACKGROUND OF THE INVENTION

1. Field of the Invention

The present invention relates, in general, to enclosures and receptacles assemblies for wiring and distribution and, more particularly, to an unit for attaching and distribution multimedia peripherals, destined especially for apartments in multi-dwelling buildings and residential, single-family homes.

2. Description of the Prior Art

There are known various enclosures for terminating wires from outlets and for distribution in residences wires for voice, data and video. Such enclosures are used in new installations and retrofits and can be surface-mounted or recessed. The disadvantages of the aforementioned enclosures reside in the limited positioning possibilities for the electric/electronic components, in the limited reliability of the attachments of components and in no secure closure of the enclosures.

Attempts have been made to eliminate or at least to alleviate the foregoing shortcomings. For example, U.S. Pat. No. 8,680,407, granted on Mar. 25, 2014 to Chan for a "Modular Enclosure Assembly for Terminals Wiring and Distribution" discloses an upper and a lower enclosure subassemblies interconnected by a partial interpenetration. That assembly is designed to enable extensions by combining adjacent subassemblies and is intended for use in large companies and offices, in multi-apartments buildings and in factories.

II. SUMMARY OF THE INVENTION

A first objective of the unit for attaching and distribution multimedia peripherals, according to the present invention, is to devise a compact unit that accommodates therein the positioning of electric/electronic components of different sizes and configurations;

A second objective of the present unit is to eliminate the usual attachments of components via cable ties, which are not re-usable, and to replace them by clasping-escaping devices; and A third objective of the present invention is to provide an unit that can be secured to a wall, or stand on a pedestal, and can be locked to preempt an unwanted access therein.

Based on the above objectives, the inventors developed an unit for attaching and distribution multimedia peripherals which comprises an assembly for clasping-escaping and a receptacle-terminal assembly.

The assembly for clasping-escaping includes an L-shape subassembly comprising a vertical wall provided with backwards projecting, vertically spaced and inverted at 90° T-beams used to connect the L-shape subassembly to a parallelepipedic open box of the receptacle-terminal assembly. A bottom plate, centrally located at the lowest part of the vertical wall and perpendicularly disposed to the latter, extends outwardly. A passage starting above the bottom plate and formed in the lowest part of the vertical wall extends along the whole length of the bottom plate. A base of the passage ends, oppositely to the vertical wall, in a pair of serrations. A channel starting with an opening in the vertical wall is formed by opposite, inverted at 90° U-shape indentations, separated by a vertical continuation of the passage.

The clasping-escaping subassembly incorporates a vertically standing plate. A fixed tongue extending perpendicularly on and outwardly from the vertically standing plate, while a flat bar, which is coplanar with the fixed tongue, extendis perpendicularly on and inwardly from the vertically standing plate. The flat bar folds on itself at an end opposite the vertically standing plate and traverses the vertical wall. The flat bar has a width commensurate with a width of vertical continuation of the passage, i.e. is delimited by sides of the channel. An easy-sliding fit is established between sides of the channel and the flat bar. The flat bar, after folding on itself in a zone, extends into a diverging strip that incrementally distances from a horizontal line starting from the zone where the flat bar folds. The diverging strip is provided with a multitude of serrations, downwardly directed. The diverging strip ends forwardly, after the multitude of serrations, into a mobile finger pushing tongue.

The receptacle-terminal assembly includes the parallelepipedic open box subassembly which has a vertical, lateral access and an attaching cover. The parallelepipedic open box subassembly incorporates a rectangular frame provided with a rear base wall, a top and a bottom elongated strip plates and a left and a right lateral, elongated strip plates. A pair of juxtaposed, horizontally extending plurality of T profile protrusions is used. Each of the T profile protrusion incorporates a T profile elongated stem. A series of knurls disposed along, above and underneath of each the T profile elongated stem creates a friction between the T profile elongated stems and the pair of backwardly projecting, vertically spaced and inverted at 90° T-beams.

More specifically, in the foregoing unit, each of the pair of backwards projecting, vertically spaced and inverted at 90° T-beams forms a plain butt joint and has an outwardly projecting flange. Outwardly projecting flanges of the pair of backwards projecting, vertically spaced and inverted at 90° T-beams is used to connect the L-shape subassembly to the parallelepipedic open box subassembly of the receptacle-terminal assembly. The rear base wall includes, in immediate proximity of each of its vertical lateral extremity, a frontward projecting, vertical elongated strip; The rear base wall is defined by a longitudinal axis of symmetry and is proximately flanked by the frontward projecting, vertical elongated strips and each of the horizontally extending plurality of T profile protrusions extends vertically and successively, in tandem.

More specifically, as well, the present unit further comprises a key hole mounting bracket, which constitutes an integral part, formed by a front vertical wall and a back vertical wall. The front vertical wall and the back vertical wall are horizontally spaced and laterally interconnected and at a bottom. The front vertical wall centrally comprises, starting from a top, a triangular guiding entrance aligned with and followed by a vertical slot. The back vertical wall extends into the pair of backwards projecting, vertically spaced and inverted at 90° T-beams used for cooperating with the parallelepipedic open box subassembly. A locating fixture, adaptable to interconnect a part to the key hole mounting bracket, includes a disc located behind the front vertical wall and extends into a split pin, provided with two forcibly squeezable prongs that traverses the front vertical wall. The split pin with two forcibly squeezable prongs is adaptable to be engaged by pressing it against an orifice of an electric/electronic component.

III. BRIEF DESCRIPTION OF THE DRAWINGS

Although the characteristic features of the invention will be particularly pointed out in the claims, the invention itself and the manner in which it may be made and used may be better understood by referring to the following description and accompanying drawings. Like reference numerals refer to like parts throughout the several views of the drawings in which:

FIG. 2 is a perspective view of an assembly for clasping-escaping incorporated in the present invention;

FIG. 3 shows a back view of the assembly for clasping-escaping;

FIG. 4 depicts a side elevation view of the assembly for clasping-escaping indicating a local view X and a longitudinal cross-section, local view Y;

FIG. 5 depicts an enlarged image of local view X, shown in FIG. 4;

FIG. 6 depicts an enlarged image of the longitudinal cross-section of local view Y, shown in FIG. 4;

FIG. 9 illustrates a perspective view of the clasping-escaping subassembly;

IV. DESCRIPTION OF A PREFERRED EMBODIMENT

Figure 1:
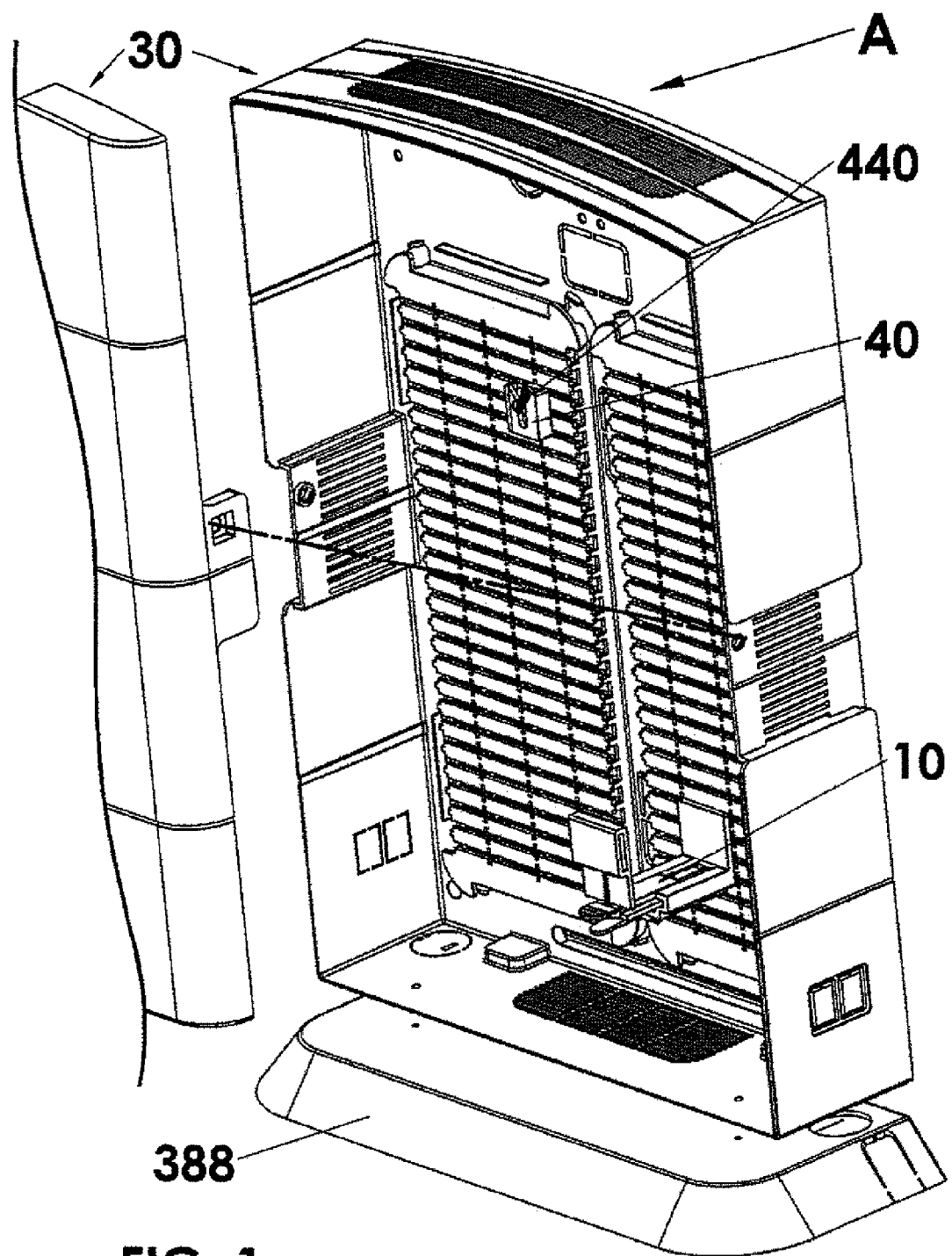
FIG. 1 is a perspective view of the present invention.
Figure 8:
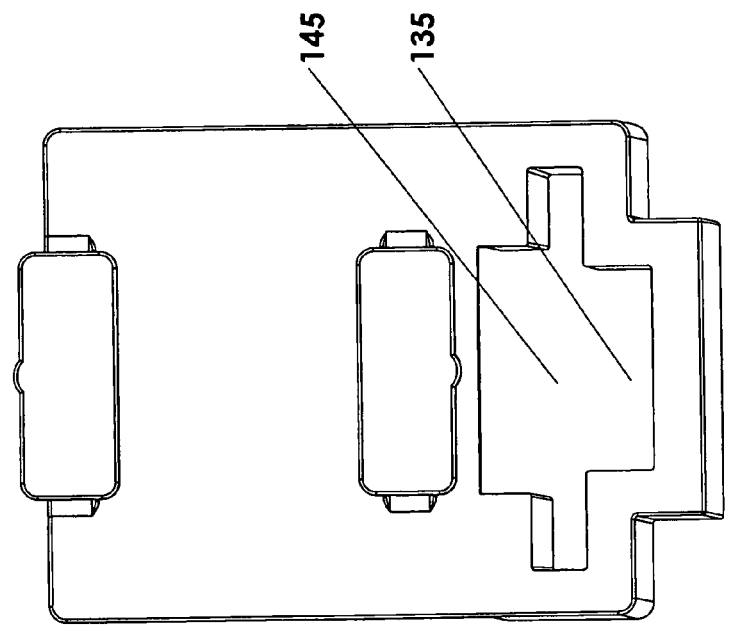
FIG. 8 shows a back view of the L-shape subassembly.
Figure 7:
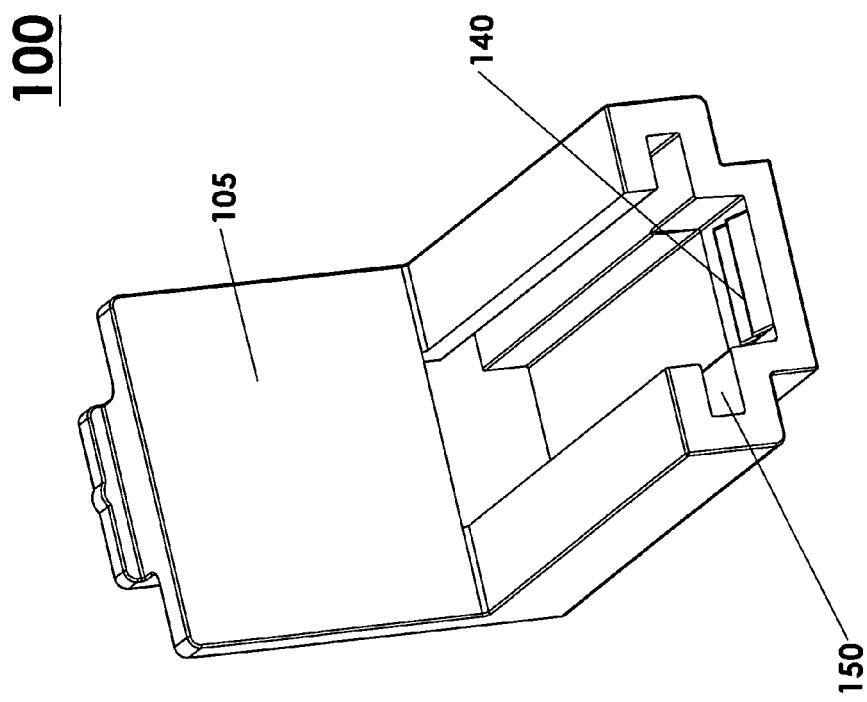
FIG. 7 illustrates a perspective view of an L-shape subassembly included in the assembly for clasping-escaping shown in FIG. 2.
Figure 10:
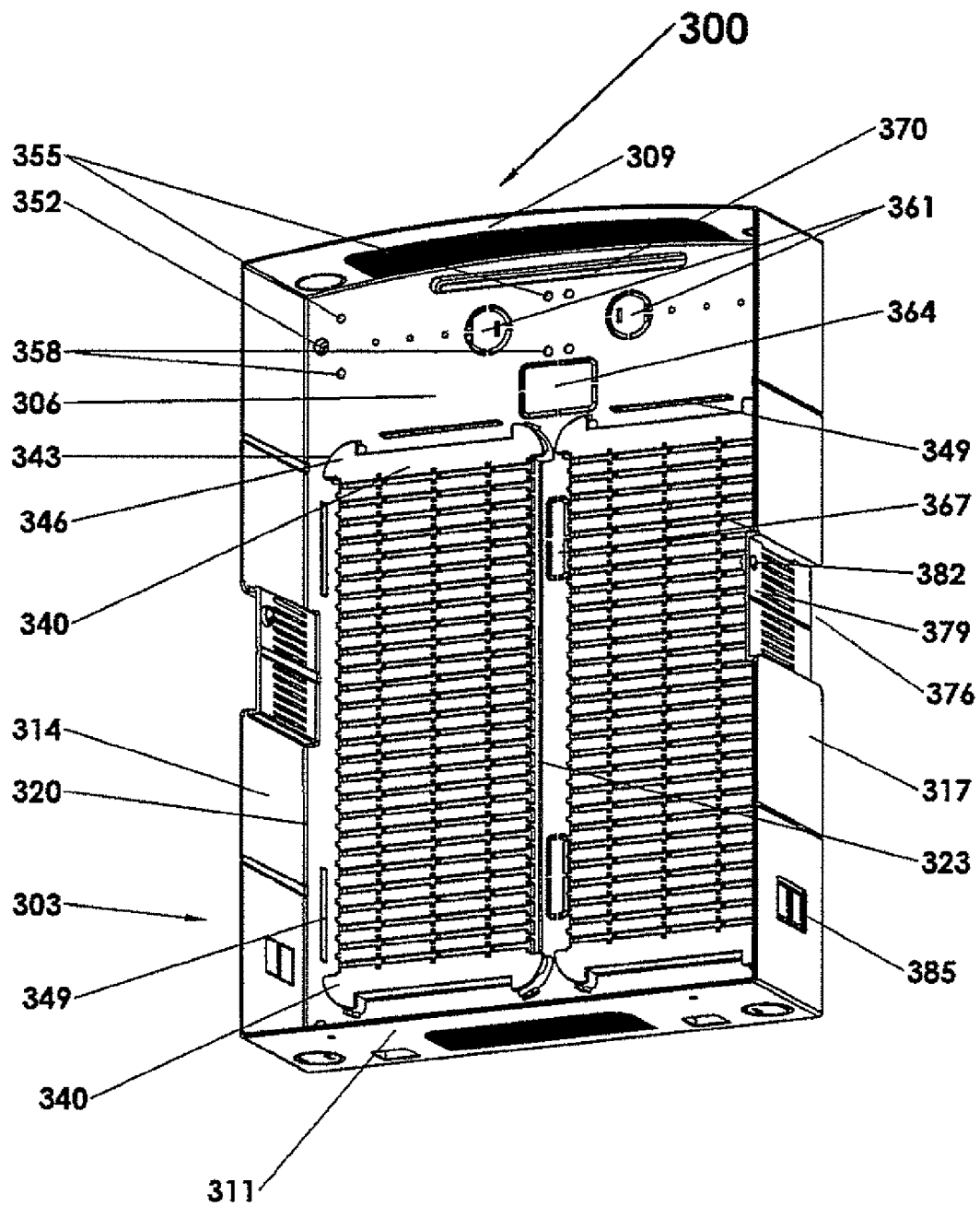
FIG. 10 illustrates a perspective front view/partially turned to the left/of a parallelepipedic open box subassembly of a receptacle-terminal assembly, included in the present invention.
Figure 11:
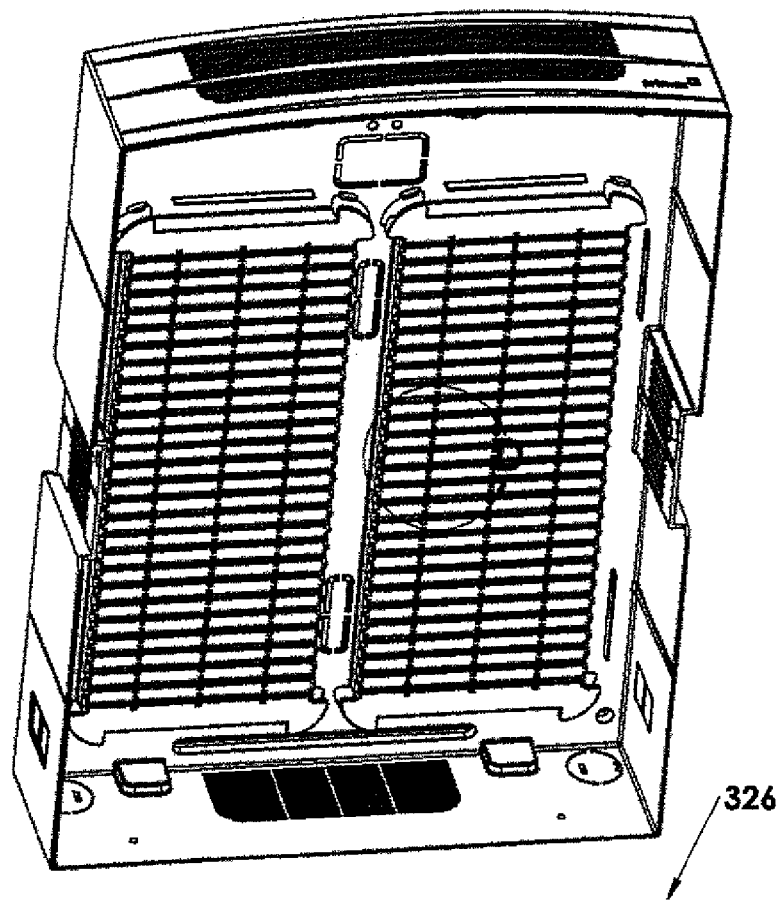
FIG. 11 illustrates a perspective front view/partially turned to the right/of the parallelepipedic open box subassembly, shown in FIG. 10 and including a local view D.
Figure 12:
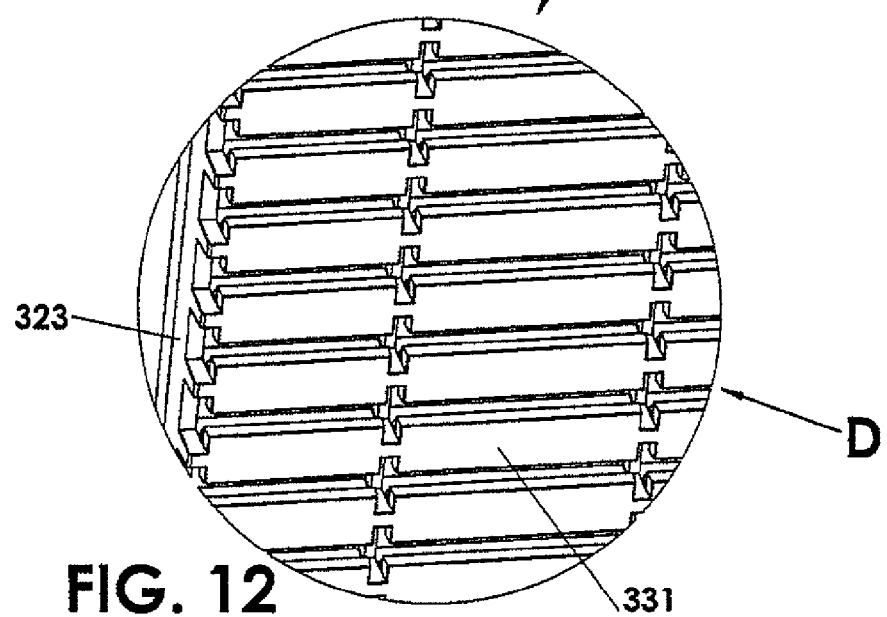
FIG. 12 depicts an enlarged image of local view D, shown in FIG. 11.
Figures 13, 14:
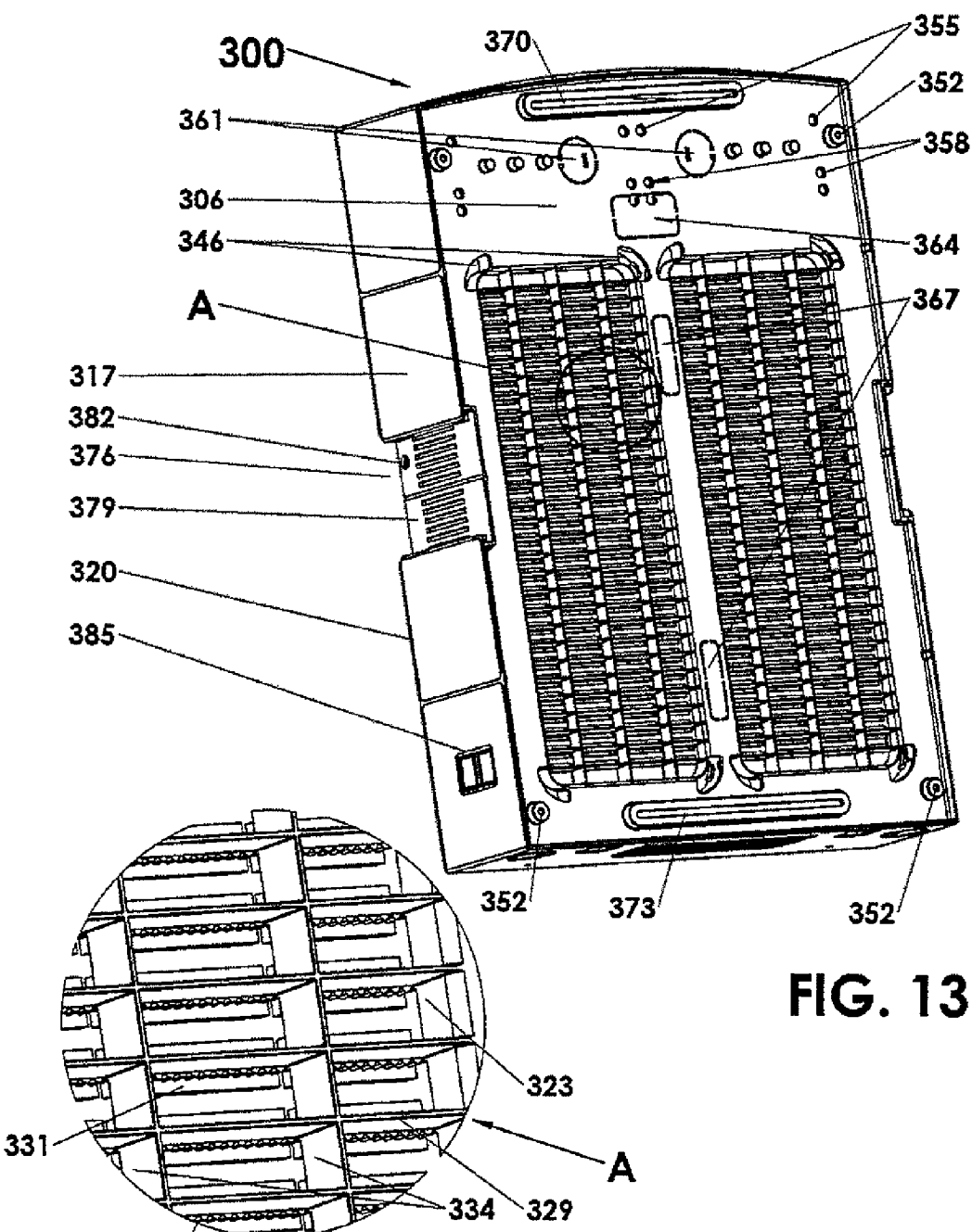
FIG. 13 illustrates a perspective back view/partially turned to the right/of the parallelepipedic open box subassembly, shown in FIGS. 10 and 11 and including a local view A.
FIG. 14 depicts an enlarged image of local view A, shown in FIG. 13.
Figure 15:
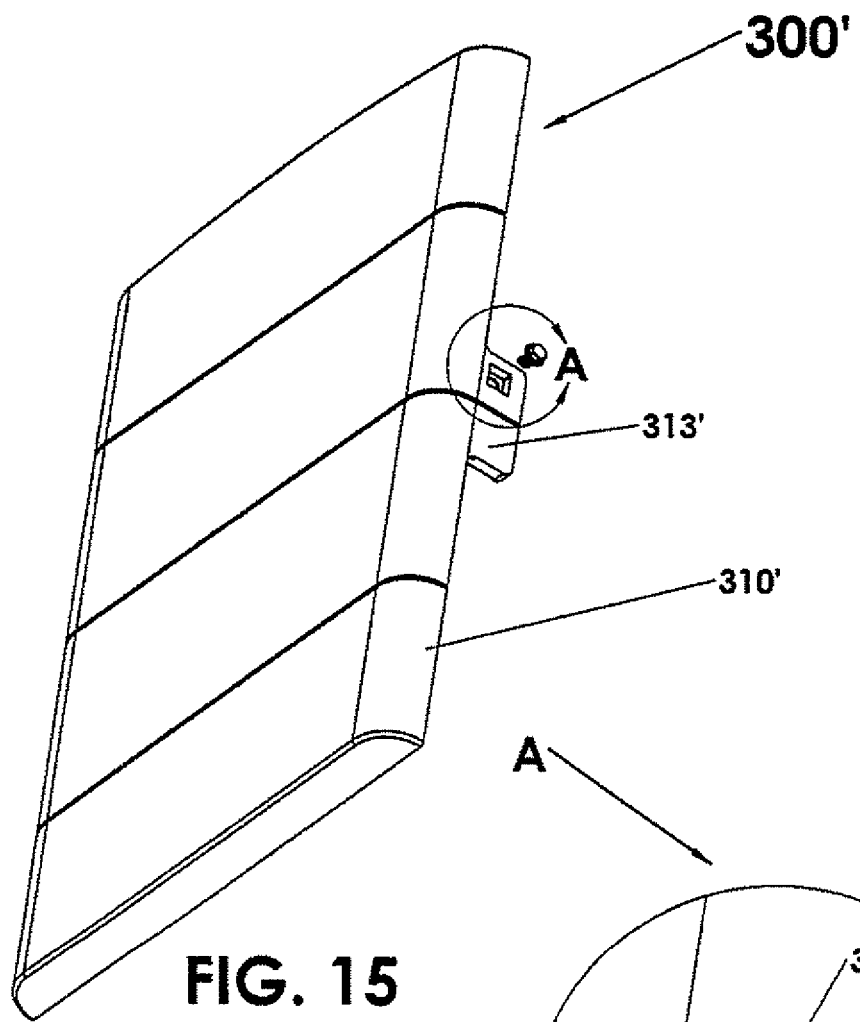
FIG. 15 is a perspective front view of an attaching cover for the parallelepipedic open box subassembly, including a local view A.
Figure 16:
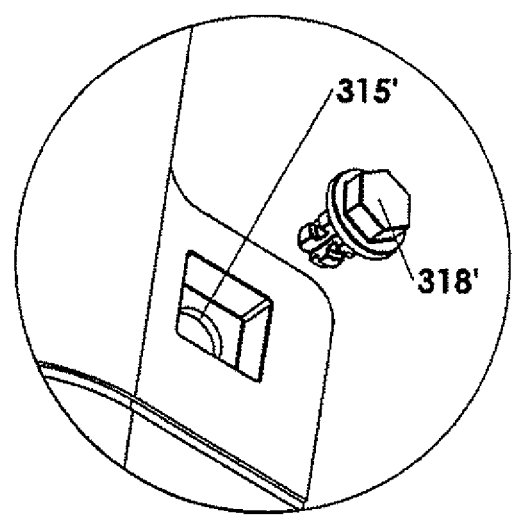
FIG. 16 depicts an enlarged image of local view A, shown in FIG. 15.
Figure 18:
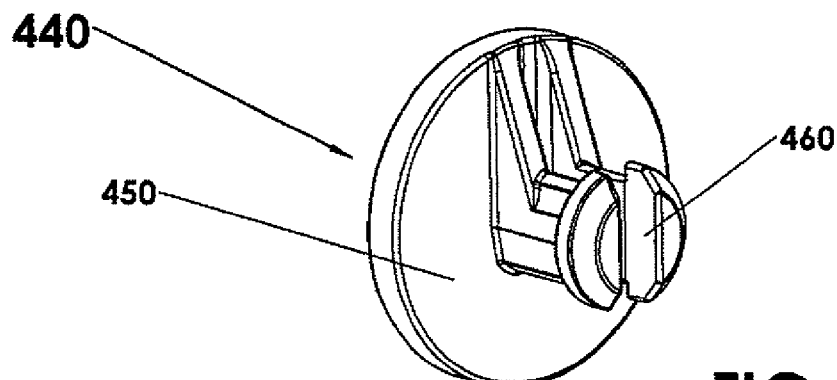
FIG. 18 illustrates a perspective view of a locating fixture, adaptable to be interconnected with the key hole mounting bracket of FIG. 17.
Figure 17:
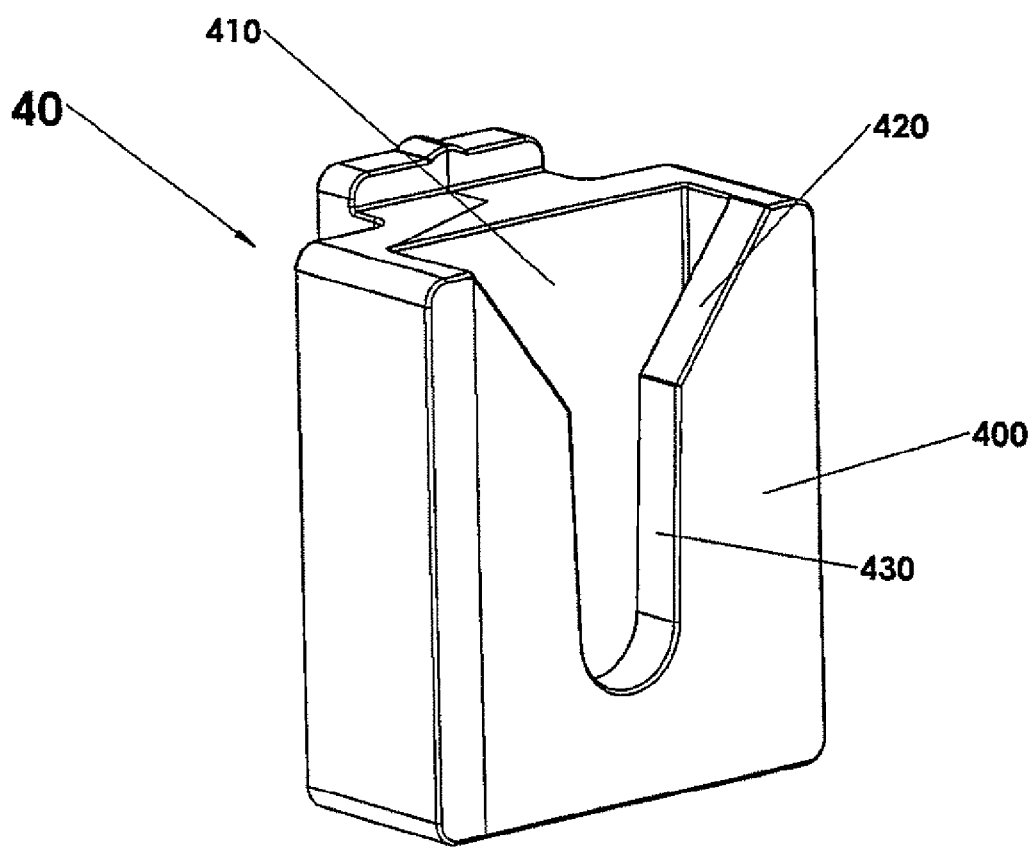
FIG. 17 illustrates a perspective view of a key hole mounting bracket, adapted to be used with the present invention.

As a caveat, before different embodiments of the present invention are explained in detail, it is to be understood that the invention is not limited in its application to the structural details and the arrangements of the components set forth in the following description and illustrated in the accompanying drawings. The invention is applicable to other embodiments and of being practiced or of being carried out in various variants. Also, it to be understood that the terms used herein with reference to the orientation of the "Unit for attaching and distribution multimedia peripherals", such as "horizontal", "vertical", "forward", "backward" and the like, are only used to better understand the description of the present invention with reference to its usual, vertical position of use. The "Unit for attaching and distribution multimedia peripherals" is generally designated with capital letter A.

Unit for attaching and distribution multimedia peripherals A comprises an assembly for clasping-escaping, generally designated with numeral 10, intended for positioning, size adjusting and retaining-releasing electric/electronic components, including an L-shape subassembly 100 incorporating a vertical wall 105 provided with a pair of backwards projecting, vertically spaced and inverted at 90° T-beams 110; each of the latter forms a plain butt joint and has an outwardly projecting flange 115; the outwardly projecting flanges 115 are used to connect L-shape subassembly 100 to a parallelepipedic open box subassembly 300, detailed farther in the present specification; a bottom plate 120, centrally located at the lowest part of vertical wall 105 and perpendicularly disposed to the latter, extends outwardly; bottom plate 120 has its lateral margins 125 retracted from the transverse extremities 130 of vertical wall 105; a passage 135 starting above bottom plate 120 and formed in the lowest part of vertical wall 105 extends along the whole length of bottom plate 120; a base of passage 135 ends, oppositely to vertical wall 105, in a pair of serrations 140 having a saw like appearance with, backwardly directed, tooth like projections; a channel 145 starting with an opening in vertical wall 105 is formed by opposite, inverted at 90° U-shape indentations 150, separated by a vertical continuation of passage 135;

a clasping-escaping subassembly 200 incorporates a vertically standing plate 205.terminating at its upper side by a folded back on itself portion 210 incorporating a throughout aperture.215 adapted for inserting a cable tie (not shown) for a supplementary attachment of electric/electronic components with distinct sizes/shape or when a single clasping-escaping subassembly 200 is used; a fixed tongue 220 extends perpendicularly on and outwardly from vertically standing plate 205, while a flat bar 225, which is coplanar with fixed tongue 220, extends perpendicularly on and inwardly from vertically standing plate 205; flat bar 225 folds on itself at an end opposite vertically standing plate 205 and traverses vertical wall 105; flat bar 225 has a width commensurate with a width of vertical continuation of passage 135, i.e. delimited by sides of channel 145; an easy-sliding fit is established between sides of channel 145 and flat bar 225; flat bar 225, after folding back in a zone 230, extends into a diverging strip 235, that incrementally distances from a horizontal line (not shown) starting from zone 230 where flat bar 225 folds back; back diverging strip 235 is provided with a multitude of serrations 240, directed downwardly and formed by forwardly directed teeth; diverging strip 235 ends forwardly, after multitude of serrations 240, in a mobile finger pushing tongue 245, when an electric/electronic component is displaced and, then, captured between vertical wall 105 and vertically standing plate 205, the pair of serrations 140 is engaged with a corresponding number of the multitude of serrations; thus, a moderate force used to slide vertically standing plate 205 enables, via a meshing of the pair of serrations 140 with a corresponding number from the multitude of serrations 240, to firmly secure an electric/electronic component to clasping-escaping subassembly 200, while a relatively greater force applied upwardly to mobile finger pushing tongue 245 circumvents the meshing; thus, gripping and locking of an electric/electronic component cease and an escapement of the latter results; an intermediary elongated plate 250, situated between flat bar 225 and diverging strip 235, is united in one body with flat bar 225, and is able to slide along channel 145, respectively in opposite, inverted at 90° U-shape indentations 150, which perform the function of bilateral sliding tracks;

said unit for attaching and distribution multimedia peripherals A further comprises
- a receptacle-terminal assembly 30 that includes:
- a parallelepipedic open box subassembly 300 with a vertical, lateral access; and
- an attaching covers 300'.

Parallelepipedic open box subassembly 300 incorporates a rectangular frame 303 provided with a rear base wall 306, a top elongated strip plate 309 and a bottom elongated strip plate 311 and a left lateral elongated strip plate 314 and a right lateral elongated strip plate 317.

Rear base wall 306 incorporates, in immediate proximity of each vertical lateral extremity 320, a pair of frontward projecting, vertical elongated strip 323. Rear base wall 306 is defined by a longitudinal axis of symmetry (not shown), proximately flanked by frontward projecting, vertical elongated strips 323. A pair of juxtaposed, horizontally extending plurality of T profile protrusions 326 is used; each one of the pair of juxtaposed, horizontally extending plurality of T profile protrusions 326 is located between a pair of vertical strips 323 situated proximately of a lateral extremities 320 and another pair of vertical strip 323 situated in proximity of above mentioned longitudinal axis of symmetry. Each horizontally extending plurality of T profile protrusions 326 extends vertically and successively/in tandem/. Each T profile protrusion 326 incorporates a T profile elongated stem 329, which is perpendicularly directed to a pair of vertical strips 323 and is framed laterally and partially between that pair of vertical strips 323. Partially, T profile elongated stem 329 extends outwards beyond the pair of vertical strips 323. A T profile flange 331 is located at and perpendicular to an external end of T profile elongated stem 329. Several vertical, rigidity separators 334, intercalated between the vertical strips 323, are so inserted, that they interrupt T profile elongated stem 329 in a number of places corresponding the number of the several vertical, rigidity separators 331.

A series of knurls 337 is disposed along, above and underneath, of each T profile elongated stem 329, at an intersection with T profile flange 331. The purpose of series of knurls 337 is to create a supplementary friction between T profile elongated stems 329 and a pair of backwardly projecting, vertically spaced and inverted at 90° T-beams 110. Thus, a positional stability of assembly for clasping-escaping 10 with respect to receptacle-terminal assembly 30 is enhanced. An outwardly open bracket 340 is provided above and beneath each one of the pair of juxtaposed, horizontally extending plurality of T profile protrusions 326. Outwardly open bracket 340 incorporates at its corners 343 rounded engaging zones 346. Outwardly open brackets 340 provided above and beneath each one of the pair of juxtaposed, horizontally extending plurality of T profile protrusions 326 are adapted for wrapping conductors/wires around each one of juxtaposed, horizontally extending plurality of T profile protrusions 326. Besides rounded engaging zones 346, flat segments 349, vertically projecting from rear base wall 306 are placed immediately above outwardly open brackets 340, in parallel to the latter. A pair of flat segments 349 are spacedly located, laterally along and in the immediate proximity of each horizontally extending plurality of T profile protrusions 326. Flat segments 349, together with rounded engaging zones 346, are adapted to contribute to guiding wires during wrapping around the pair of juxtaposed, horizontally extending plurality of T profile protrusions 326. A round chamfered opening 352 provided with beveled edges is placed adjacent to each corner of rear base wall 306. Round chamfered apertures 352 are adapted to be used with countersunk screws (not shown) for securing parallelepipedic open box subassembly 300 to a wall (also not shown), which is contiguous with rear base wall 306.

Between each round chamfered opening 352, situated at an upper side of rear base wall 306, close to an upper corner of the latter, and longitudinal axis of symmetry of rear base wall 306, two upper, spaced pin holes 355 and two lower, spaced pin holes 358 are provided. Push-lock pins (not shown) are adapted to interact with two upper, spaced pin holes 355 and two lower, spaced pin holes 358 for securing: a) to the right side of rear base wall 306—a "Patch Panel for Copper Wire Connection"; and b) to the left side of rear base wall 306—for a "Fiber Optic Splice Accessory".

Rear base wall 306 includes as well a) a pair of annular knockout 361 located symmetrically on both sides of longitudinal axis of symmetry of rear base wall 306; one of the pair of annular knockouts 361 is located in a perimeter defined, at a left side of longitudinal axis of symmetry of rear base wall 306, by two upper, spaced pin holes 355 and two lower, spaced pin holes 358; b) a rectangular knockout 364 placed under the pair of annular knockouts 361 and co-linearly with longitudinal axis of symmetry of rear base wall 306; c) a pair of elongated rectangular rectangular knockout 367 placed vertically between the pair of juxtaposed, horizontally extending plurality of T profile protrusions 326; and d) an upper elongated horizontal slot 370 and a lower horizontal slot 373.

The aforementioned knockouts and elongated horizontal slots serve for entry into and exit from receptacle-terminal assembly 30 of wire/conductors.

Left lateral, elongated strip plate 314 and right lateral elongated strip plate 317 are identical. A rectangular recess 376, provided with an internal wall 379, is located at midway between a top and a bottom of left lateral, elongated strip plate 314. An identical rectangular recess 376, provided with an internal wall 379, is located at midway between a top and a bottom of right lateral, elongated strip plate 317. Internal wall 379 incorporates a screw hole 382. Furthermore, a double rectangular knockout 385 is included close to the bottom of left lateral elongated strip plates 314. An identical double, rectangular knockout 385 is included close to the bottom of right lateral elongated strip plates 317. Bottom of elongated strip plate 311 is adaptable to be mounted on and attached to a pedestal 388, when securing parallelepipedic open box subassembly 300 to a wall (also not shown), contiguous with rear base wall 306, is not used.

Attaching cover 300' is basically congruent with a rectangular shape, has a turned up brim 310' and is provided with opposing lateral projection 313', configured to engage internal walls 379. A hole provided protuberance 315', coaxial with screw hole 382, is included in each opposing lateral projection 313'.

A pair of screws 318' inserted through hole provided protuberances 315' is used to tighten into screw holes 382 for fastening attaching cover 300' to parallelepipedic open box subassembly 300. Alternatively or supplementarily to assembly for clasping-escaping 10 use can be made, generally for similar purposes, of a key hole mounting bracket 40 that constitutes an integral part formed by a front vertical wall 400 and a back vertical wall 410. Front vertical wall 400 and back vertical wall 410, which are horizontally spaced, are interconnected laterally and at a bottom. Front vertical wall 400 comprises, centrally and starting from a top, a triangular guiding entrance 420 aligned with and followed by a vertical slot 430. Back vertical wall 410 extends into the pair of backwards projecting, vertically spaced and inverted at 90° T-beams 110, as those incorporated in the assembly for clasping-escaping 10 and intended for cooperating with parallelepipedic open box subassembly 300.

A locating fixture 440, adaptable to interconnect an electric/electronic component to key hole mounting bracket 40, includes a disc 450 intended to be located behind said front vertical wall 400 and extending into a split pin, provided with two forcibly squeezable prongs 460 for traversing said front vertical wall 400. Locating fixture 440 is displaced, firstly through triangular guiding entrance 420 and then, in vertical slot 430. Split pin with two forcibly squeezable prongs 460 is adaptable to be engaged by pressing it against an orifice of an electric/electronic component/both not shown/.

What we claim is:

1. A unit for attaching and distribution multimedia peripherals comprising
    an assembly for clasping-escaping; and
    a receptacle-terminal assembly;
said assembly for clasping-escaping including
    an L-shape subassembly comprising a vertical wall provided with backwards projecting, vertically spaced and inverted at 90° T-beams used to connect said L-shape subassembly to a parallelepipedic open box subassembly of said receptacle-terminal assembly; a bottom plate, centrally located at a lowest part of said vertical wall and perpendicularly disposed to said lowest part of said vertical wall, extending outwardly; a passage starting above said bottom plate and formed in said lowest part of said vertical wall extending along a whole length of said bottom plate; a base of said passage ending, oppositely to said vertical wall, in a pair of serrations; a channel starting with an opening in said vertical wall being formed by opposite, inverted at 90° U-shape indentations, separated by a vertical continuation of said passage; and
    a clasping-escaping subassembly incorporating a vertically standing plate; a fixed tongue extending perpendicularly on and outwardly from said vertically standing plate, while a flat bar, which is coplanar with said fixed tongue, extending perpendicularly on and inwardly from said vertically standing plate; said flat bar folding back on itself at an end opposite said vertically standing plate and traversing said vertical wall; said flat bar having a width commensurate with a width of vertical continuation of said passage, i.e. delimited by sides of said channel; an easy-sliding fit being established between sides of said channel and said flat bar; said flat bar, after folding on itself in a zone, extends into a diverging strip that incrementally distances from a horizontal line starting from said zone where said flat bar is folding; said diverging strip being provided with a multitude of serrations, downwardly directed; said diverging strip ending forwardly, after said multitude of serrations, into a mobile finger pushing tongue;
    said receptacle-terminal assembly including:
    said parallelepipedic open box subassembly having a vertical, lateral access; and
    an attaching cover;
said parallelepipedic open box subassembly incorporating a rectangular frame provided with a rear base wall, a top and a bottom elongated strip plates and a left and a right lateral, elongated strip plates; a pair of juxtaposed, horizontally extending plurality of T profile protrusions being used; each of said pair of juxtaposed, horizontally extending plurality of T profile protrusions comprising a horizontally extending plurality of T profile protrusions; each one of said horizontally extending plurality of T profile protrusions incorporates a T profile elongated stem; a series of knurls disposed along, above and underneath of each said T profile elongated stem creates a positioning friction between said T profile elongated stems and said backwards projecting, vertically spaced and inverted at 90° T-beams.

2. The unit for attaching and distribution multimedia peripherals, as defined in claim 1, wherein said backwards projecting, vertically spaced and inverted at 90° T-beams is forming a plain butt joint and having an outwardly projecting flange; outwardly projecting flanges of said backwards projecting, vertically spaced and inverted at 90 T-beams being used to connect said L-shape subassembly to said parallelepipedic open box subassembly of said receptacle-terminal assembly; said rear base wall including, in immediate proximity of each of its vertical lateral extremity, a frontward projecting, vertical elongated strip; said rear base wall, being defined by a longitudinal axis of symmetry, is proximately flanked by said frontward projecting, vertical elongated strips; and each of said horizontally extending plurality of T profile protrusions extending vertically and successively, in tandem.

3. The unit according to claim 1, further comprising a key hole mounting bracket, which constitutes an integral part, formed by a front vertical wall and a back vertical wall; said front vertical wall and said back vertical wall, being horizontally spaced, are interconnected laterally and at a bottom; said front vertical wall centrally comprising, starting from a top, a triangular guiding entrance aligned with and followed by a vertical slot; said back vertical wall extending into said backwards projecting, vertically spaced and inverted at 90° T-beams being used for cooperating with said parallelepipedic open box subassembly; a locating fixture, adaptable to be interconnected to said key hole mounting bracket, including a disc located behind said front vertical wall and extending into a split pin provided with two forcibly squeezable prongs traversing said front vertical wall; said locating fixture being displaced, firstly through said triangular guiding entrance and then, in said vertical slot, said split pin with two forcibly squeezable prongs being adaptable to be engaged, by pressing, against an orifice of a component.

* * * * *

UNITED STATES PATENT AND TRADEMARK OFFICE
CERTIFICATE OF CORRECTION

| | | |
|---|---|---|
| PATENT NO. | : 9,534,728 B2 | Page 1 of 1 |
| APPLICATION NO. | : 14/121739 | |
| DATED | : January 3, 2017 | |
| INVENTOR(S) | : Mahmud Harji et al. | |

It is certified that error appears in the above-identified patent and that said Letters Patent is hereby corrected as shown below:

On the Title Page

Item (72), "Chun Nam James Chan Chan" should read: --James Chun Nam Chan--

Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*